(12) United States Patent
Nial, Jr. et al.

(10) Patent No.: US 6,219,218 B1
(45) Date of Patent: *Apr. 17, 2001

(54) MAGNETIC FLUX SUPPRESSION SYSTEM

(75) Inventors: John A. Nial, Jr., Park Hall; J. David De Leon, Bel Alton; Nickolas Kaloterakis, White Plains; T. William Ammons, Jr., Temple Hills; Joseph Dulcey, Waldorf, all of MD (US)

(73) Assignee: The United States of America as represented by the Secretary of the Navy, Washington, DC (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/792,267

(22) Filed: Jan. 31, 1997

(51) Int. Cl.⁷ ........................................................ F42B 3/18
(52) U.S. Cl. ........................... 361/212; 361/213; 361/818; 307/91
(58) Field of Search .................................... 361/212, 213, 361/816, 818, 217, 218; 307/89, 91; 333/172; 102/202.2

(56) References Cited

U.S. PATENT DOCUMENTS

| | | | |
|---|---|---|---|
| 3,343,491 | * 9/1967 | Peters, Jr. ........................... | 102/202.2 |
| 3,416,033 | * 12/1968 | Hoover et al. ....................... | 361/218 |
| 3,572,247 | * 3/1971 | Warshall ............................. | 102/202.2 |
| 3,640,224 | * 2/1972 | Petrick et al. ...................... | 102/202.2 |
| 3,735,705 | * 5/1973 | Hudson, Jr. et al. ............... | 102/202.2 |
| 3,971,024 | * 7/1976 | Clark, Jr. et al. .................... | 361/212 |
| 4,517,895 | * 5/1985 | Rucker ............................... | 102/202.2 |
| 4,592,280 | * 6/1986 | Shores ................................ | 102/202.2 |
| 4,607,313 | * 8/1986 | Shaw et al. .......................... | 361/218 |
| 4,779,532 | * 10/1988 | Riley et al. ......................... | 102/202.2 |
| 4,887,180 | * 12/1989 | Climent et al. ....................... | 307/91 |
| 4,942,495 | * 7/1990 | Peres et al. ........................... | 361/212 |
| 4,967,665 | * 11/1990 | Baginski ............................. | 102/202.2 |
| 5,099,762 | * 3/1992 | Drapala .............................. | 102/202.2 |
| 5,222,013 | * 6/1993 | Schwalm ............................. | 351/212 |
| 5,279,225 | * 1/1994 | Dow et al. ........................... | 102/202.2 |
| 5,905,226 | * 5/1999 | Baginski ............................. | 102/202.2 |

* cited by examiner

*Primary Examiner*—Fritz Fleming
(74) *Attorney, Agent, or Firm*—Mark Homer

(57) ABSTRACT

An electromagnetic flux suppression includes a three stage filtering system to protect against electromagnetic interference and electrostatic discharge and has a first stage high voltage section that filters a high voltage pulse by providing a spark gap to ionize the ambient air and thus effectively form a shunt. A second stage filter has a front end capacitive interface followed by an inductive line to filter out radio frequency arcing that occurs between two bodies thus exposing them to radio frequency radiation. A third stage filter includes a radio frequency low pass filter to reinforce the capacitive inductance filter.

15 Claims, 5 Drawing Sheets

MAGNETIC FLUX SUPPRESSION SYSTEM

BACKGROUND OF THE INVENTION

This invention relates to electromagnetic flux suppression systems and more particularly to a filtering system to protect hazard susceptible apparatus such as airborne ordnance including motor powered rockets against radio frequency (RF) energy from radar, communications equipment or other electronic equipment, and to protect against electromagnetic radiation (EMR) and electrostatic discharge (ESD) commonly found in the environment where various equipment is employed in conjunction with electronic equipment of the type noted above which is susceptible to EMR and ESD hazards. Although the specific embodiment described herein is disclosed as used to protect carrier based helicopter borne ordnance such as rockets, it will be understood that the filtering system is useful for a variety of aerospace applications where the ESD and EMR hazards noted are found such as protecting aircraft including helicopter borne medical and life saving equipment and equipment such as electro-explosive cable cutters and the like.

Prior to this invention, airborne ordnance equipment of the type described above was not protected from ESD and EMR hazards or was not adequately protected from such hazards. Hazards of electromagnetic radiation to ordnance (HERO) can occur, for example, when aircraft carrier helicopter borne ordnance such as a motor powered rocket is loaded on a carrier thus presenting a hazard to the equipment as well as personnel in the vicinity. The hazard includes EMR generated by various electronic equipment such as a radio transmitter and can be received by the aircraft (helicopter) structure. An additional hazard is RF arcing created when two bodies at different induced electrical potentials approach each other. Because the structures receive radiated power, high potentials are induced in the structures. Because the frequency characteristics of the arcing are broad band, they can pose a hazard because they can be in the frequency band at which the system operates. Other hazards can occur because of lightning.

DESCRIPTION OF THE PREFERRED EMBODIMENT

The invention, as embodied herein, comprises an electromagnetic flux suppression apparatus for protection of equipment against electromagnetic radiation (EMR), especially nearby high power EMR, radiating near two bodies that are in proximity, or, are intermittently making contact. This environment is commonly known as Hazards of Electromagnetic Radiation to Ordnance (HERO). HERO tests are conducted at a broad range of frequencies using Continuous Wave (CW) and Pulsed Power modulations. The interaction between the two bodies, such as an aircraft and a rocket, during CW tests causes arcing at various frequencies. The resulting power signal from the Arc contains frequency components in a much broader band, even though the radiated signal is in a narrow frequency band (e.g., the carrier frequency). The same effect described for CW modulation can apply to pulsed power modulation (used for radar). One preferred embodiment of the invention protects airborne ordnance from both electrostatic discharge (ESD) and EMR.

The apparatus comprises a means for inputting power from various sources, such as EMR/HERO from direct sources or radio frequency arcing or ESD, that draws such sources away from other parts of the equipment or ordnance. This power input means is directed into a means for first stage filtering that is located proximately to the power input means. The first stage filter means reduces the input power through a shunt capacitor to reduce the EMR/HERO power from proceeding into the equipment or ordnance. In one embodiment of the invention, the power that passes through the first stage filter means is conducted through a conductor means running along a stabilizing rod to a means for second stage filtering. The second stage filter means reduces high frequency power through a low pass filter. This reduces ESD to an acceptable level. Yet another embodiment of the invention may include a means for third stage filtering, that accepts energy from the second stage filter means, comprising a low pass filter to primarily further reduce the power transmitted by ESD, and, to secondarily reduce the power from HERO type sources.

Figure 2:
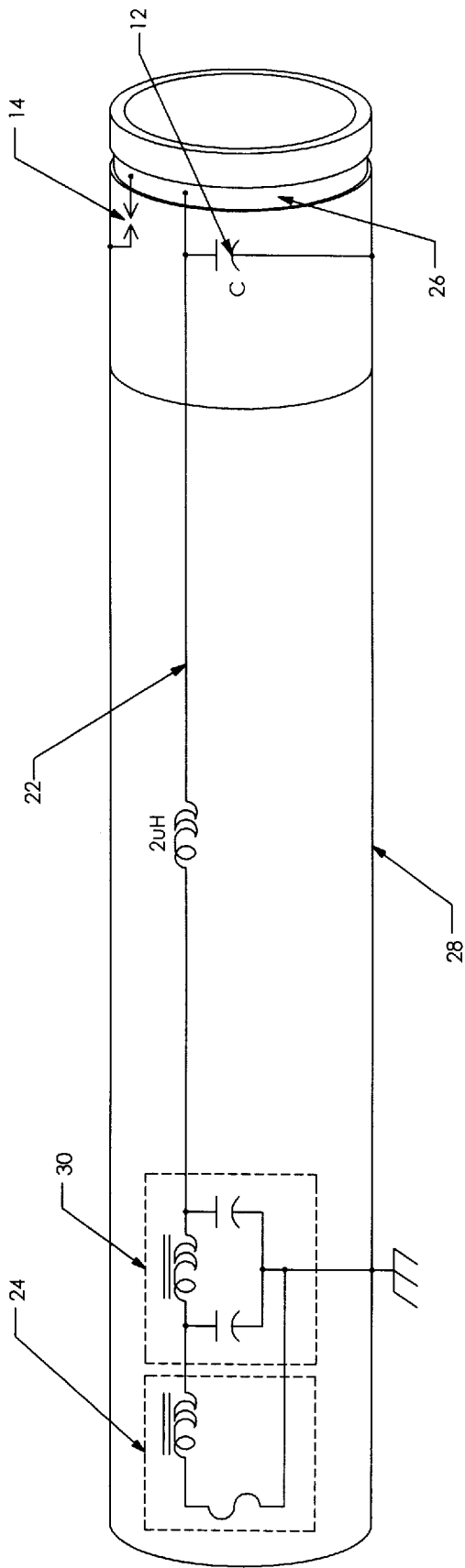
FIG. 2 is an electrical schematic of the invention.
Figure 3:
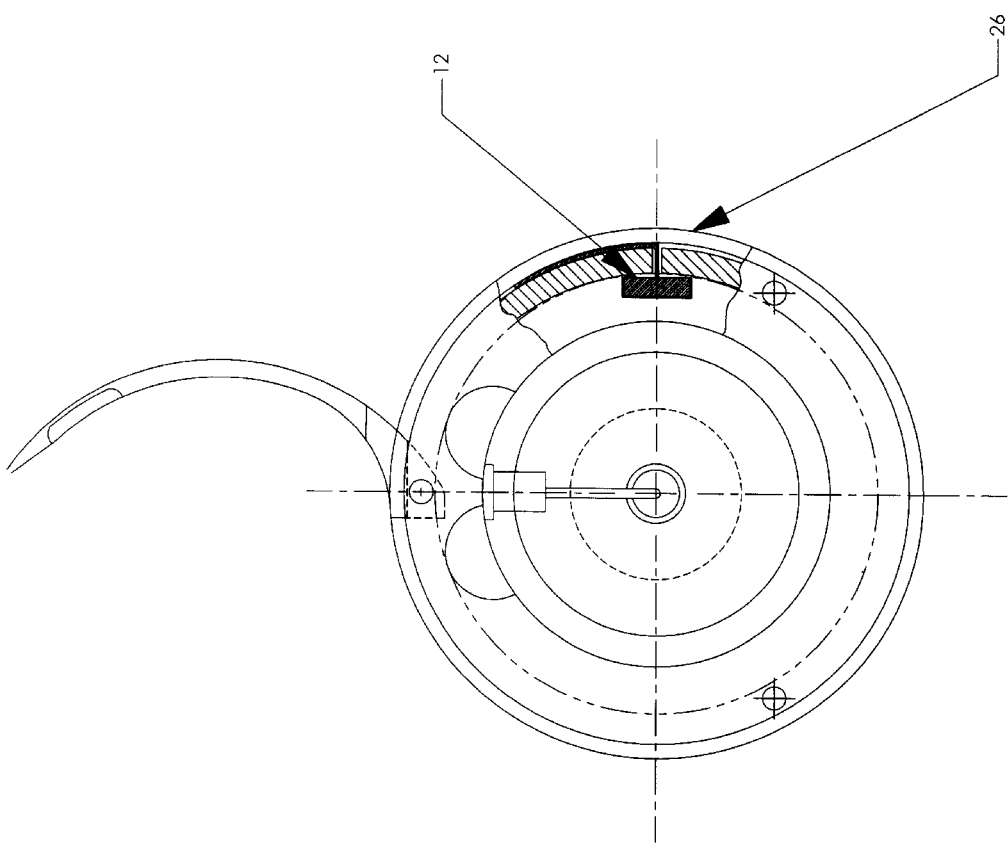
FIG. 3 is a cross sectional view of one embodiment of the first section of the filter of this invention.

Referring to FIG. 2, the power input means 26, in this embodiment a contact band, operates to effectively shunt electrical power from vulnerable electronic equipment and to provide a conduit into the first stage filter means 12. The first stage filter means 12, comprises a capacitor, designed to reduce or block power from EMR/HERO sources from proceeding further inside the equipment or ordnance. The first stage filter means 12, comprises a location proximate to the power input means 26. The small distance between the first stage filter means 12, and the power input means 26 forces a very low inductance, and an effective high frequency shunt. One preferred location is more fully depicted in FIG. 3, where the first stage filter means 12 is placed under and adjacent to the power input means 26. In one preferred embodiment of the invention, the power input means comprises approximately 300,000 volts. In another preferred embodiment of the invention, the first stage filter means 12 allows reduced high frequency power to pass through the first stage filter means 12.

Figure 1:
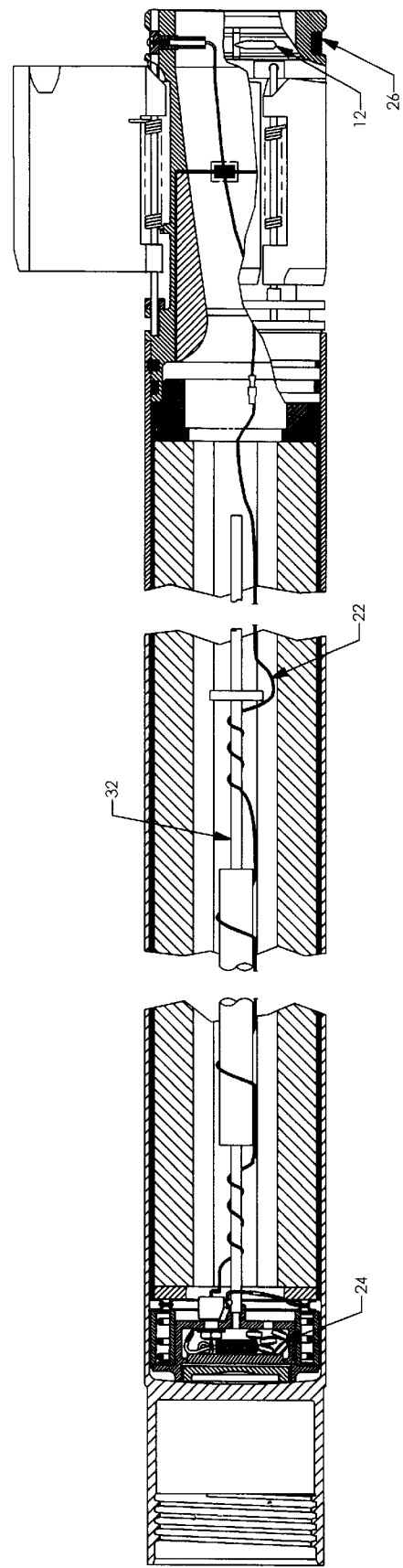
FIG. 1 is a sectional view of a motor powered rocket employing one embodiment of this invention.
Figure 4:
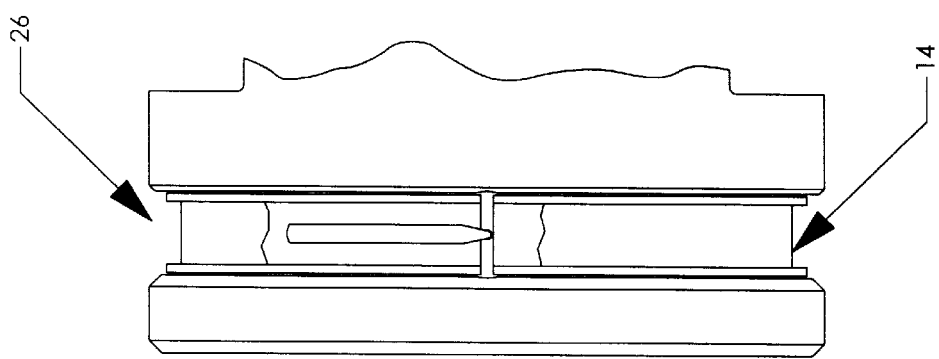
FIG. 4 is a view of one embodiment of this invention comprising a contact band as the input power means.

Referring again to FIG. 2, in one embodiment of the invention, the energy that passes through the first stage filter means 12 is carried by an induction means 22 and is input into a second stage filter means 30 wherein the second stage filter means 30 reduces the high frequency power via a low pass filter, therefore, reducing ESD to an acceptable level. In this embodiment, the first stage filter means 12 reduces or eliminates ESD protection. Therefore, the selection of the capacitance parameter of the first stage filter means 12 should be selected to limit its adverse effect on ESD filtering to provide both EMR/HERO and ESD protection. One preferred value for the capacitor is approximately 10 nanofarads. In this embodiment, a spark gap 14, that naturally exists between the power input means and the equipment or ordnance, begins the reduction of ESD that is completed via the second stage filter means 30. This embodiment is more clearly set forth in FIG. 4. In one preferred embodiment of the invention, set forth in FIG. 1, the induction means 22 comprises an inductance wire supported by a stabilizing rod 32. The preferred length of the conductor means 22 comprises sufficient length to facilitate ionization of the ESD prior to inputting the power into the second stage filter means 30. In one embodiment of the invention, the induction means comprises less than approximately 2 micro-henries. In another embodiment of the invention the second stage filter 30 comprises a lossy type inductor comprising an inductor and two capacitors in a PI type configuration that comprises an attenuation capable of preventing the initiation of and damage to a rocket motor. Another embodiment of the invention provides attenuation of greater than 150 dB for frequencies greater than 150 kHz in the design configuration, or conventionally, 63 dB loss at frequencies greater than 150 kHz using a 50 ohm insertion loss test per MIL-STD-220.

Figure 5:
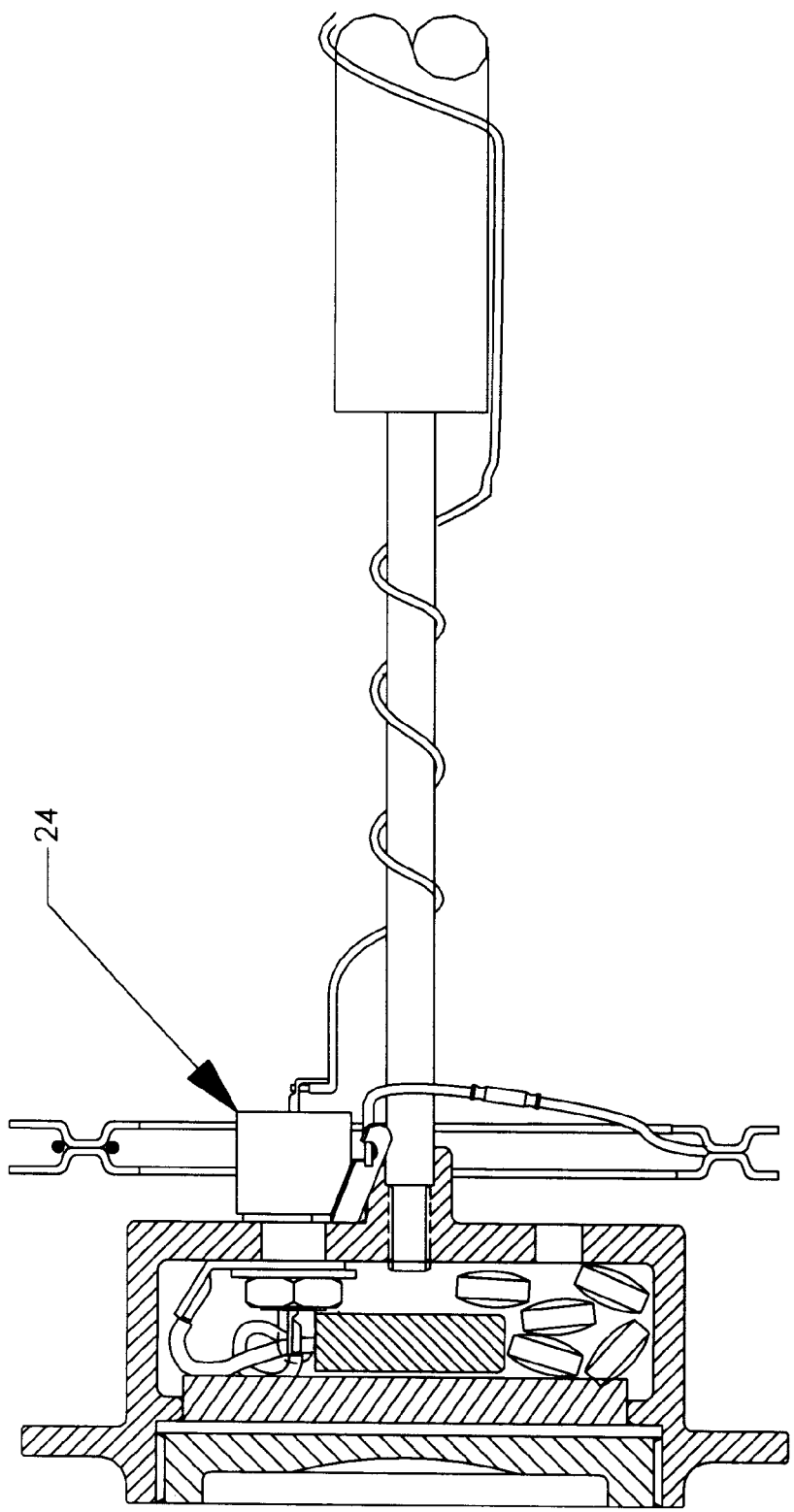
FIG. 5 is a view of one embodiment of the third section of the filter of this invention.

In another embodiment of the invention, the apparatus further comprises a third stage filter means 24 that accepts energy from the second stage filter means 30, including a low pass filter to, primarily, further reduce the power transmitted by ESD, and, secondarily, reduce the power from HERO type sources. In one preferred embodiment of the invention, the second stage filter means 30 comprises a location proximate to the third stage filtering means 24. In another preferred embodiment of the invention, the third stage filter means 24 comprises a filtered initiator (shown in FIG. 5).

The invention also comprises a method for reducing both EMR/HERO and ESD from ordnance. FIG. 2 shows a rocket motor tube 28 with a contact band 26. This contact band 26 provides the entry point for electricity, including the arming signal, for the ordnance. As noted above, this contact band also provides the entry point for HERO and ESD. Next, the naturally existing spark gap 14 between the contact band and the airborne ordnance ionizes the ambient air. A first stage filter means 12 is provided, proximate to the contact band 26, comprising a capacitor to reduce EMR/HERO entering the ordnance. An induction wire 22 is provided to carry energy that passes through the first stage filter means 12 to the second stage filter means 30. The induction wire 22 transmits electrical energy from the firing signal to the initiator as well as facilitating ESD protection by the second stage filter means. Therefore, for the method to operate to maximum effect, the firing signal passes through all subsequent filters to initiate the ordnance. The second stage filter means 30 comprises a low pass filter, to reduce high frequency power, and, therefore provide ESD protection. An initiator 24 is provided, preferably proximate to the second stage filter means 30, the initiator 24 comprises a low pass filter, that accepts energy from the second stage filter means 30 and further reduces high frequency power providing further ESD and HERO protection, but allows sufficient power from the intended firing signal to initiate the initiator 24. This method allows for one integrated system to reduce both EMR/HERO and ESD, which has never before been accomplished.

This invention could be used in myriad other applications to protect equipment attached to vehicles while the vehicles are in the presence of electromagnetic radiation such as from radio, communications, or radar equipment and electrostatic environments such as near airports (such as from helicopter discharge per MIL-STD-331 and STANAG 4560), radar transmissions, radio transmissions, aircraft, or ship decks.

What is claimed is:

1. An electromagnetic flux suppression apparatus to protect vulnerable electronic equipment, comprising:
   means for inputting power from external electromagnetic radiation (EMR), electrostatic discharge (ESD), and electrical energy, having output, wherein the power input means draws EMR, ESD and electrical energy away from the vulnerable electronic equipment; and,
   means for first stage filtering of electromagnetic radiation from the output of the input power means, proximate to the input power means wherein low inductance between the first stage filter means and the input power means results, comprising a low inductance capacitor having output and a value.

2. The electromagnetic flux suppression apparatus of claim 1, wherein said input power means comprises a contact band.

3. The electromagnetic flux suppression apparatus of claim 2, wherein the output of the first stage filter means comprises reduced high frequency power EMR, ESD, and electrical energy, further comprising:
   means for ionizing ambient air proximate to the input power means;
   means for induction that transmits the output of the first stage filter having input wherein the induction means facilitates ionization of the output of the first stage filter means;
   means for second stage filtering, having output, that receives the input from the induction means wherein the second stage filter means reduces electrostatic discharge through a low pass filter.

4. The electromagnetic flux suppression apparatus of claim 3, wherein the ionization means comprises a spark gap.

5. The electromagnetic flux suppression apparatus of claim 4, wherein the induction means comprises an inductance wire.

6. The electromagnetic flux suppression apparatus of claim 5, wherein the inductance wire comprises less than 2 micro-henries of inductance.

7. The electromagnetic flux suppression apparatus of claim 6, wherein the value of the low inductance capacitor comprises approximately 10 nanofarads.

8. The electromagnetic flux suppression apparatus of claim 7, wherein the ESD of the input power means comprises ESD generated from a helicopter.

9. The electromagnetic flux suppression apparatus of claim 8, wherein the ESD of the input power means comprises approximately 300,000 Volts.

10. The electromagnetic flux suppression apparatus of claim 7, wherein the second stage filtering means comprises a lossy type inductor and two capacitors comprising a PI configuration.

11. The electromagnetic flux suppression apparatus of claim 7, wherein the second stage filter means comprises an attenuation of greater than approximately 150 dB at frequencies greater than approximately 150 KHz.

12. The electromagnetic flux suppression apparatus of claim 7, further comprising a third stage filtering means, that receives the output of the second stage filter means, comprising a low pass filter to further reduce electrostatic discharge.

13. The electromagnetic flux suppression apparatus of claim 12, wherein the second stage filter means comprises a location proximate to the third stage filtering means.

14. The electromagnetic flux suppression apparatus of claim 13, wherein the third stage filter means comprises a filtered initiator.

15. A method for reducing both electromagnetic radiation and electrostatic discharge from airborne ordnance, comprising the steps of:
   providing a contact band for the entry of a firing signal, electrostatic discharge, and electromagnetic radiation to the airborne ordnance;
   providing a spark gap between the contact band and the airborne ordnance wherein the spark gap ionizes the ambient air;

providing a first filter comprising a capacitor to reduce electromagnetic radiation proximate to the contact band;

providing an inductance wire to carry energy that passes through the first filter;

providing a second filter, having output, comprising a lossy type inductor, and two capacitors comprising a PI configuration, that comprises a low pass filter, to reduce high frequency power from electrostatic discharge, that accepts the energy from the first filter through the induction wire;

providing an initiator comprising a third filter, being a low pass filter, that accepts output from the second filter and further reduces electrostatic discharge wherein the firing signal passes through the third filter to initiate the initiator.

* * * * *